US006649078B2

(12) United States Patent
Yu

(10) Patent No.: US 6,649,078 B2
(45) Date of Patent: Nov. 18, 2003

(54) THIN FILM CAPILLARY PROCESS AND APPARATUS

(75) Inventor: Conrad M. Yu, Antioch, CA (US)

(73) Assignee: The Regents of the University of California, Oakland, CA (US)

( * ) Notice: Subject to any disclaimer, the term of this patent is extended or adjusted under 35 U.S.C. 154(b) by 316 days.

(21) Appl. No.: 09/732,004

(22) Filed: Dec. 6, 2000

(65) Prior Publication Data

US 2003/0029723 A1 Feb. 13, 2003

(51) Int. Cl.[7] .............................................. C03C 15/00
(52) U.S. Cl. ............................ 216/96; 216/95; 216/97; 216/99; 216/100
(58) Field of Search ......................... 422/99, 100, 102, 422/129, 130, 131; 204/400, 193; 435/283.1, 287.1, 288.3, 288.4, 288.5; 216/95, 96, 97, 99, 100

(56) References Cited

U.S. PATENT DOCUMENTS

| 4,357,205 | A |   | 11/1982 | Trausch et al. ............. 156/656 |
| 4,668,374 | A |   | 5/1987  | Bhagat et al. .............. 204/412 |
| 4,716,903 | A |   | 1/1988  | Hansen et al. |
| 4,758,926 | A |   | 7/1988  | Herrell et al. ............. 361/385 |
| 4,791,935 | A |   | 12/1988 | Baudino et al. |
| 4,860,444 | A |   | 8/1989  | Herrell et al. ............... 29/840 |
| 4,903,701 | A |   | 2/1990  | Moore et al. |
| 4,935,040 | A |   | 6/1990  | Goedert ..................... 55/197 |
| 4,938,228 | A |   | 7/1990  | Righter et al. |
| 4,997,537 | A |   | 3/1991  | Karger et al. ............. 204/182.8 |
| 5,039,492 | A |   | 8/1991  | Saaski et al. |
| 5,086,772 | A |   | 2/1992  | Larnard et al. |
| 5,102,415 | A |   | 4/1992  | Guenther et al. ............ 606/159 |
| 5,112,460 | A |   | 5/1992  | Karger et al. ............. 204/182.8 |
| 5,113,869 | A |   | 5/1992  | Nappholz et al. |
| 5,199,428 | A |   | 4/1993  | Obel et al. |
| 5,292,340 | A |   | 3/1994  | Crosby et al. |
| 5,300,093 | A |   | 4/1994  | Koestner et al. |
| 5,309,919 | A |   | 5/1994  | Snell et al. |
| 5,312,446 | A |   | 5/1994  | Holschbach et al. |
| 5,313,953 | A |   | 5/1994  | Yomtov et al. |
| 5,365,934 | A |   | 11/1994 | Leon et al. |
| 5,383,512 | A |   | 1/1995  | Jarvis ....................... 164/46 |
| 5,404,877 | A |   | 4/1995  | Nolan et al. |
| 5,411,031 | A |   | 5/1995  | Yomtov |
| 5,518,001 | A |   | 5/1996  | Snell |
| 5,533,957 | A |   | 7/1996  | Aldea |
| 5,575,929 | A | * | 11/1996 | Yu et al. .................... 216/10 |
| 5,583,281 | A |   | 12/1996 | Yu ............................ 73/23.42 |
| 5,628,917 | A |   | 5/1997  | MacDonald et al. .......... 216/2 |
| 5,641,400 | A |   | 6/1997  | Kaltenbach et al. ...... 210/198.2 |
| 5,645,564 | A |   | 7/1997  | Northrup et al. ........... 606/205 |
| 5,730,187 | A |   | 3/1998  | Howitz et al. .............. 137/803 |
| 5,749,900 | A |   | 5/1998  | Schroeppel et al. |
| 5,783,452 | A | * | 7/1998  | Jons et al. .................. 436/183 |
| 5,836,868 | A |   | 11/1998 | Ressemann et al. ......... 606/159 |
| 5,842,787 | A |   | 12/1998 | Kopf-Sill et al. ........... 366/340 |
| 5,843,118 | A |   | 12/1998 | Sepetka et al. ............. 606/194 |
| 5,882,936 | A |   | 3/1999  | Bensten et al. |
| 5,895,398 | A |   | 4/1999  | Wensel et al. .............. 606/159 |
| 5,911,737 | A |   | 6/1999  | Lee et al. .................... 606/209 |
| 5,932,799 | A | * | 8/1999  | Moles ....................... 73/53.01 |
| 6,073,482 | A | * | 6/2000  | Moles ....................... 73/53.01 |
| 6,102,917 | A |   | 8/2000  | Maitland et al. ............ 606/108 |
| 6,136,212 | A | * | 10/2000 | Mastrangelo et al. ......... 216/49 |
| 6,176,962 | B1| * | 1/2001  | Soane et al. ................ 156/292 |
| 6,210,986 | B1| * | 4/2001  | Arnold et al. ................ 438/42 |
| 6,221,654 | B1| * | 4/2001  | Quake et al. ............. 435/287.3 |
| 6,258,514 | B1| * | 7/2001  | Montgomery ............... 430/515 |
| 6,331,490 | B1| * | 12/2001 | Stevens et al. .............. 438/754 |
| 6,423,465 | B1| * | 7/2002  | Hawker et al. .............. 430/203 |
| 6,437,551 | B1| * | 8/2002  | Krulevitch et al. ......... 324/71.1 |
| 6,485,625 | B1| * | 11/2002 | Simpson et al. ............. 204/601 |
| 6,497,995 | B2| * | 12/2002 | Skrobis ...................... 430/323 |
| 6,498,010 | B1| * | 12/2002 | Fitzgerald et al. ............. 435/6 |

FOREIGN PATENT DOCUMENTS

| DE | 19638501   | 4/1998 |
| EP | 633 468    | 5/1994 |
| EP | 668 500    | 2/1995 |
| WO | WO98/22811 | 5/1998 |

* cited by examiner

Primary Examiner—Jill Warden
Assistant Examiner—Dwayne K Handy
(74) Attorney, Agent, or Firm—Alan H. Thompson; James S. Tak

(57) ABSTRACT

Method and system of forming microfluidic capillaries in a variety of substrate materials. A first layer of a material such as silicon dioxide is applied to a channel etched in substrate. A second, sacrificial layer of a material such as a polymer is deposited on the first layer. A third layer which may be of the same material as the first layer is placed on the second layer. The sacrificial layer is removed to form a smooth walled capillary in the substrate.

18 Claims, 2 Drawing Sheets

THIN FILM CAPILLARY PROCESS AND APPARATUS

The United States Government has rights in this invention pursuant to Contract No. W-7405-ENG-48 between the United States Department of Energy and the University of California for the operation of Lawrence Livermore National Laboratory.

FIELD OF THE INVENTION

The present invention relates to microfluidic substrates, and more specifically, it relates to the formation of microfluidic capillaries.

BACKGROUND OF THE INVENTION

Microfluidic technology represents a revolution in laboratory experimentation. Microfluidic circuits allow for scientific experiments that used to be performed at the laboratory bench to be done in volumes as small as a nanoliter. Microfabrication makes it possible to create intricate designs of interconnected channels that are extremely small. Each pattern is designed to produce a series of fluid manipulation steps that will execute an experiment. Hoewever, current capillary electrophoresis on a chip often requires glass to glass or quartz to quartz bonding to form the interconnected channels.

SUMMARY OF THE INVENTION

Aspects of the present invention include a method comprising: depositing a first layer on a substrate surface; depositing a second layer on the first layer; depositing a third layer on the second layer; and removing the second layer to form a capillary between the first and third layers.

Further aspects of the present invention include an apparatus comprising: a substrate having a capillary lined with a material from the group consisting of glass, quartz, polysilicon, silicon nitride, silicon dioxide, and boron nitride/silicon dioxide.

BRIEF DESCRIPTION OF THE DRAWINGS

The accompanying drawings, which are incorporated into and form a part of the disclosure.

DETAILED DESCRIPTION OF THE INVENTION

The embodiments disclosed herein are directed to improved microfluidic devices. Such devices may include a substrate having top, bottom and side surfaces and interconnected fluidic channels within which material is transported during scientific experiments such as electrophoresis. As used herein, the terms "microscale" or "microfabricated" generally refer to structural elements or features of a device which has at least one fabricated dimension in the range of from about 0.1 microns to about 500 microns. Thus, a device referred to as being microfabricated or microscale will include at least one structural element or feature having such a dimension. When used to describe a fluidic element, such as a capillary, channel, passage, or conduit, the terms "microscale," "microfabricated" or "microfluidic" generally refer to one or more fluid capillaries, channels, passages, or conduits which have at least one internal cross-sectional dimension, e.g., depth, width, length, or diameter that is less than 500 microns, and typically between 0.1 microns and about 500 microns. A typical capillary constructed in accordance with the methods discussed below may have a width and depth in the ranges of approximately 5 to 50 microns and, typically, width and depth in the ranges of approximately 10 to 20 microns.

FIGS. 1A–1I illustrate a method and system of using a sacrificial layer to form a capillary or channel. In a first step, shown in FIG. 1A, capillary images are first printed on a substrate 100 by means of standard photolithography techniques using a positive photoresist layer 102 and light 104. Substrate 100 may be a silica based substrate from the group consisting of glass, quartz, pyrex, silicon or polysilicon, as well as other substrate materials, such as gallium arsenide. The substrate 100 may also be made of polymeric materials, (e.g., plastics such as polymethylmethacrylate (PMMA), polycarbonate, polytetrafluoroethylene (TEFLON™), polyvinylchloride (PVC), polydimethylsiloxane (PDMS), and polysulfone).

Figure 1A:
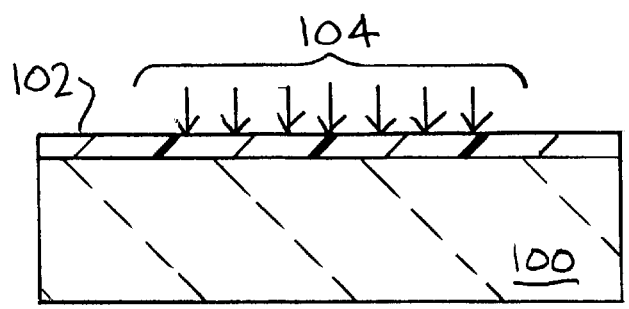
FIGS. 1A–1I illustrate a microfluidic device fabricated from a planar substrate.
Figure 1B:
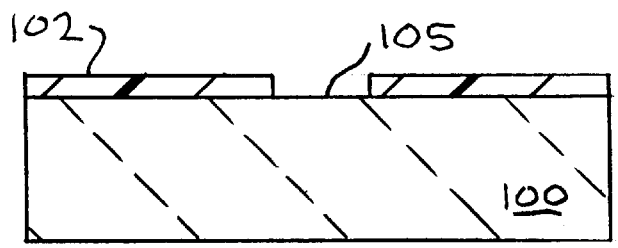
Figure 1C:
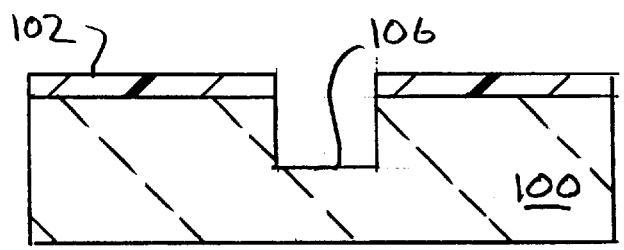
Figure 1D:
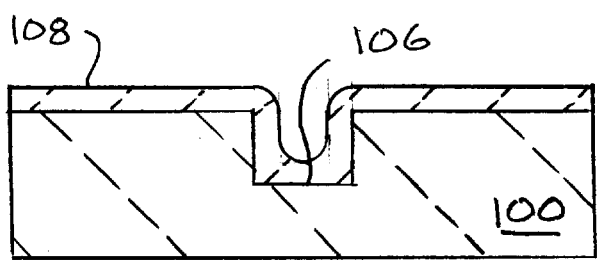

After development, the photoresist layer 102 is isotropically etched to form a channel 105 as shown in FIG. 1B. Next, the substrate 100 is etched as shown in FIG. 1C to form channel 106 with a predetermined width and depth. This predetermined width may be in the range of 5 to 50 microns and, typically, 10–20 microns. The predetermined depth may also be in the range of 5 to 50 microns and, typically, 10–20 microns. In a next step, the photoresist layer 102 is removed and a first layer 108 is coated over the substrate 100 to line the channel 106, but not fill it as shown by FIG. 1D. The first layer 108 may be applied, for example, by electron sputtering, E-beam coating or chemical vapor deposition and may comprise one of a group consisting of glass, quartz, polysilicon, silicon nitride, silicon dioxide, boron nitride, and various metals. In the disclosed embodiment, the first layer is a silicon dioxide ($SiO_2$) material with a melting temperature greater than 1000 degrees Celsius.

Figure 1E:
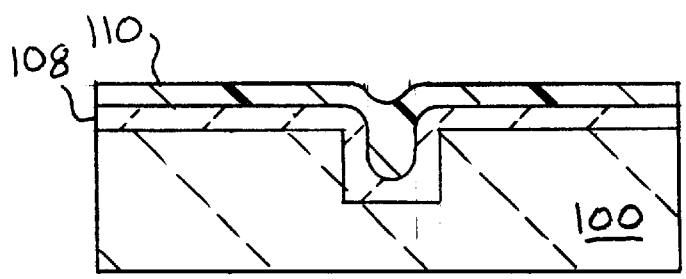

A second layer 110 such as a polymer having a high temperature melting point (e.g., wax) is next applied as shown in FIG. 1E to cover the first layer 108 through standard deposition techniques. The melting temperature of the polymer should be approximately in the range of 200 to 300 degrees Celsius, and, typically, approximately 275 degrees Celsius. This second layer 110 is a sacrificial layer or filler. In alternative embodiments, an oxide with a low temperature melting point may also be used for the second layer 110 instead of a high temperature polymer. The melting temperature of the low temperature oxide would be in the range of 200 to 250 degrees Celsius. Because of the nature of the material used in the second layer or filler 110, there is maintained the integrity or smoothness of the first layer that may provide a capillary with a smooth walled surface. The smooth walled surface of the capillary prevents blockage or hindrance of the flow of microfluidic material as it passes through the finished capillary. Typically, the smooth walled surface in the finished capillary will have a roughness approximately in the range of 40 to 60 root mean square (rms), and, typically, approximately 50 rms.

Figure 1F:
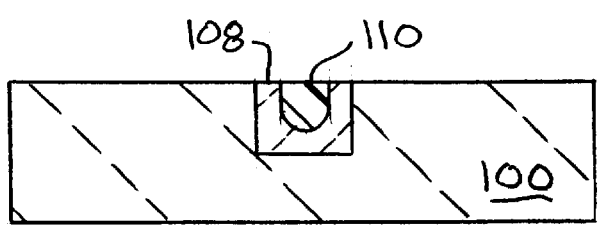

By repeating the photolithography procedures with the same mask, but negative photoresist (not shown in figures), the filler 110 and first layer 108 is removed from the unmask surface except for the channel region. The substrate 100 is then planarized by reflowing the filler 110 in the channel 106. A chemical mechanical polish (CMP) may then be performed to achieve a flat surface as shown in FIG. 1F.

Figure 1G:
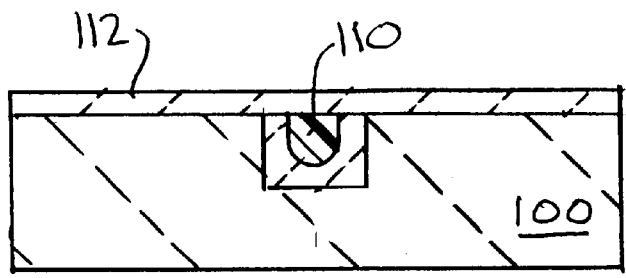
Figure 1H:
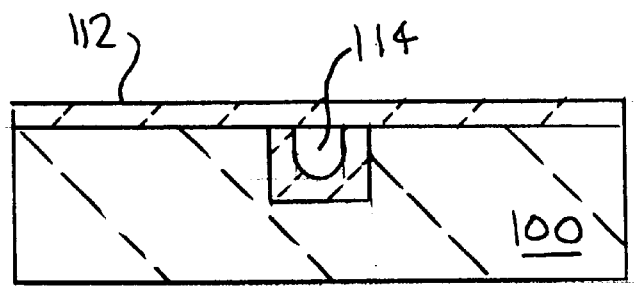

Next, a third layer 112 is applied to the substrate 100 which may be a similar or the same material as the first layer 108 and will, therefore, have a melting temperature greater than 1000 degrees Celsius. The third layer is deposited on top of the filler 110 so as to cover the whole surface of the substrate 100 as shown in FIG. 1G and produce an integral mass. The third layer 112 may be applied, for example, by electron sputtering, E-beam coating or chemical vapor deposition. Since the third layer 112 is the same or similar material as the first layer 108, the walls of the capillaries can be uniform in material. In the next step, the filler 110 is removed to form the thin film capillary 114 on the substrate 100 as shown in FIG. 1H. The filler 110 may be removed by heating and melting process.

Figure 1I:
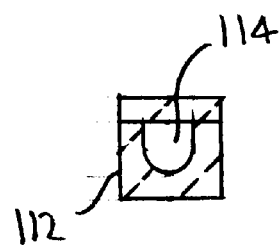

Optionally, the substrate 100 may be completely removed to form a stand alone, three dimensional thin film capillary as shown in FIG. 1I.

The embodiments disclosed herein have a wide variety of uses, including, for example, capillary electrophoresis, liquid chromatograph, miniature chemical factory, polymerase chain reaction (PCR), and other microelectromechanical (MEMS) liquid fluidic gas pumping systems that requires precise injection of liquid and gas samples. Further the embodiments described herein may be used in the performance of high throughput screening assays in drug discovery, immunoassays, diagnostics, nucleic acid analysis, including genetic analysis, and the like. As such, the embodiments described herein will often include multiple sample introduction ports or reservoirs, for the parallel or serial introduction and analysis of multiple samples.

The foregoing is illustrative of the present invention and is not to be construed as limiting thereof. The invention is defined by the following claims, with equivalents of the claims to be included therein

What is claimed is:

1. A method for the formation of micirofluidic capillaries, comprising:

depositing a photoresist layer on a surface of a substrate, carrying out photolithography procedures to form images on the photoresist layer, etching the photoresist layer to form at least one channel therein, etching the substrate to form at least one channel therein, removing the photoresist layer, depositing a first layer over the substrate and to line the surfaces of the at least one channel formed therein, depositing a second layer over the first layer carrying out photolithography procedures on the second layer, removing the second layer and first layer from the substrate except in the at least one channel region, planarizing the substrate by reflowing the second layer material located in the channel, polishing the substrate to form a flat surface thereon, depositing a third layer on the substrate surface and over the at least one channel, removing the remaining second layer material in the at least one channel located beneath the third layer to form at least one channel in the substrate lined with said first layer material.

2. The method of claim 1, additionally including removing the substrate from about the at least one lined channel.

3. The method of claim 1, wherein carrying out the photolithograph procedures is carried out by forming the photoresist layer using a positive photoresist layer and a beam of light directed thereon.

4. The method of claim 1, additionally providing the substrate of a material selected from the group consisting of glass, quartz, pyrex, silicon, polysilicon, gallium arsenide, and polymeric materials.

5. The method of claim 1, wherein etching the photoresist layer is carried out by isotropically etching.

6. The method of claim 1, wherein etching the substrate is to form the at least one channel with a width in the range of 5–50 microns and depth of 5–50 microns.

7. The method of claim 1, wherein depositing the first layer is carried out using a technique selected from the group consisting of electron sputtering, E-beam coating, and chemical vapor deposition.

8. The method of claim 1, wherein depositing the first layer is carried out using materials selected from the group consisting of glass, quartz, polysilicon, silicon nitride, silicon dioxide, boron nitride, and metals.

9. The method of claim 8, wherein the material of the first layer is a silicon dioxide with a melting temperature greater than 1000 degrees Celsius.

10. The method of claim 1, wherein depositing the second layer is carried out using a polymer having a melting point temperature in the range of 200–300 degrees Celsius.

11. The method of claim 1, wherein depositing the second layer is carried out using an oxide with a melting point in the range of 200–250 degrees Celsius.

12. The method of claim 1, wherein the at least one channel formed in the substrate formed so as to have a finished wall surface roughness in the range of 40–60 root mean square (rms).

13. The method of claim 1, wherein carrying out the photolithography procedures on the second layer is carried out using a negative photoresist.

14. The method of claim 1, wherein polishing the substrate is carried out using a chemical mechanical polish.

15. The method of claim 1, wherein depositing the third layer is carried out using similar or the same material as that of the first layer and having a melting point greater than 1000 degrees Celsius.

16. The method of claim 1, wherein depositing the third layer is carried out so as to cover the whole surface of the substrate and the at least one channel therein so as to produce an integral mass.

17. The method of claim 1, wherein depositing the third layer is carried out by a technique selected from the group consisting of electron sputtering, E-beam coating, and chemical vapor deposition.

18. The method of claim 1, wherein removing the remaining second layer material is carried out by a heating and melting process.

* * * * *